(12) United States Patent
Zhang et al.

(10) Patent No.: US 10,504,437 B2
(45) Date of Patent: Dec. 10, 2019

(54) DISPLAY PANEL, CONTROL METHOD THEREOF, DISPLAY DEVICE AND DISPLAY SYSTEM FOR ANTI-PEEPING DISPLAY

(71) Applicants: Boe Technology Group Co., Ltd., Beijing (CN); Beijing Boe Display Technology Co., Ltd., Beijing (CN)

(72) Inventors: Chunbing Zhang, Beijing (CN); Xianjuan Zhan, Beijing (CN); Yichiang Lai, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/512,603

(22) PCT Filed: May 26, 2016

(86) PCT No.: PCT/CN2016/083461
§ 371 (c)(1),
(2) Date: Mar. 20, 2017

(87) PCT Pub. No.: WO2017/161674
PCT Pub. Date: Sep. 28, 2017

(65) Prior Publication Data
US 2018/0096652 A1 Apr. 5, 2018

(30) Foreign Application Priority Data
Mar. 25, 2016 (CN) .......................... 2016 1 0180112

(51) Int. Cl.
G09G 3/3258 (2016.01)
H01L 27/32 (2006.01)
(Continued)

(52) U.S. Cl.
CPC ............. *G09G 3/3258* (2013.01); *G09G 3/20* (2013.01); *H01L 27/32* (2013.01);
(Continued)

(58) Field of Classification Search
CPC ........... G09G 3/3258; G09G 2320/068; G09G 2320/028; H01L 27/32
See application file for complete search history.

(56) References Cited

U.S. PATENT DOCUMENTS

2006/0145964 A1\* 7/2006 Park ...................... G09G 3/3233
345/76
2006/0180813 A1\* 8/2006 Kim ...................... G09G 3/3648
257/59
(Continued)

FOREIGN PATENT DOCUMENTS

CN 102110402 A 6/2011
CN 102510435 6/2012
(Continued)

OTHER PUBLICATIONS

First Office Action for Chinese Patent Application No. 201610180112.9 dated Aug. 29, 2017.
(Continued)

*Primary Examiner* — Kwang-Su Yang
(74) *Attorney, Agent, or Firm* — Calfee, Halter & Griswold LLP

(57) ABSTRACT

This disclosure relates to a display panel, a control method thereof, a display device and a display system comprising such a display panel. The display panel includes a plurality of pixel units. Each pixel unit has a plurality of subpixels Each subpixel has a display subpixel and an interference subpixel. Additionally, the interference subpixel and the display subpixel are different in at least one of color and gray scale. The display panel also includes a first control unit
(Continued)

configured to control the display subpixel to be switched on during a first period of time in each display period, and to control the interference subpixel to be switched off during the first period of time in each display period and switched on during a second period of time in each display period.

13 Claims, 2 Drawing Sheets

(51) Int. Cl.
*G09G 3/20* (2006.01)
*G09G 3/3208* (2016.01)

(52) U.S. Cl.
CPC ....... *H01L 27/3213* (2013.01); *G09G 3/3208* (2013.01); *G09G 2300/0452* (2013.01); *G09G 2320/028* (2013.01); *G09G 2320/068* (2013.01); *G09G 2340/10* (2013.01); *G09G 2358/00* (2013.01)

(56) References Cited

U.S. PATENT DOCUMENTS

| | | | | |
|---|---|---|---|---|
| 2007/0182682 | A1* | 8/2007 | Hong | .................... G09G 3/3413 345/88 |
| 2009/0009076 | A1* | 1/2009 | Maru | .................. H01L 27/3213 313/506 |
| 2009/0091238 | A1* | 4/2009 | Cok | ..................... H01L 27/322 313/498 |
| 2011/0187964 | A1 | 8/2011 | Li et al. | |
| 2012/0026136 | A1* | 2/2012 | Zhang | .................. G09G 3/3614 345/204 |
| 2013/0076785 | A1 | 3/2013 | Chen | |
| 2014/0111555 | A1 | 4/2014 | Ting et al. | |
| 2014/0264290 | A1* | 9/2014 | Brown | ................ H01L 27/3223 257/40 |
| 2015/0318447 | A1* | 11/2015 | Choi | .................... H01L 27/322 257/98 |
| 2016/0056199 | A1* | 2/2016 | Kim | .................. H01L 27/14643 250/208.1 |
| 2017/0039928 | A1 | 2/2017 | Zhang et al. | |
| 2017/0278443 | A1* | 9/2017 | Zhang | ................. H01L 51/5012 |
| 2018/0068604 | A1* | 3/2018 | Zeng | ....................... G09G 3/20 |
| 2018/0088415 | A1 | 3/2018 | Zhang et al. | |

FOREIGN PATENT DOCUMENTS

| | | |
|---|---|---|
| CN | 102779500 | 11/2012 |
| CN | 104122705 | 10/2014 |
| CN | 104656295 A | 5/2015 |
| CN | 105116561 A | 12/2015 |
| CN | 105182637 | 12/2015 |
| CN | 105627194 A | 6/2016 |

OTHER PUBLICATIONS

International Search Report and Written Opinion from PCT/CN16/83461 dated Dec. 28, 2016.

Second Office Action for Chinese Patent Application No. 201610180112.9 dated May 11, 2018.

* cited by examiner

DISPLAY PANEL, CONTROL METHOD THEREOF, DISPLAY DEVICE AND DISPLAY SYSTEM FOR ANTI-PEEPING DISPLAY

The present application is the U.S. national phase entry of PCT/CN2016/083461, with an international filling date of May 26, 2016, which claims the benefit of Chinese Patent Application No. 201610180112.9, filed on Mar. 25, 2016, the entire disclosures of which are incorporated herein by reference.

FIELD

This disclosure relates to the field of display technologies, and specifically to a display panel, a display device, a display system and a method for controlling a display panel.

BACKGROUND ART

At present, increasing importance has been attached to anti-peeping display of information. In a conventional method for anti-peeping display of information, private display of information is mainly achieved by reducing a view angle of a display panel. Specifically, only a person located right in front of the display panel is enabled to see content in the display panel, while persons located around the display panel cannot see the content in the display panel. However, this privacy approach has certain defects. For example, if both a peeper and a viewer are located right in front of the display panel, the peeper will also be able to see the content of the display. Therefore, this anti-peeping approach does not have an ideal privacy effect.

SUMMARY

In view of the above, this disclosure attempts to improve the anti-peeping effect of the display panel.

To this end, this disclosure proposes a display panel. The display panel comprises a plurality of pixel units and a first control unit. Each pixel unit comprises a plurality of subpixels. Each subpixel comprises a display subpixel and an interference subpixel. The interference subpixel and the display subpixel have different colors and/or gray scales. The first control unit is configured to control the display subpixel to be switched on during a first period of time in each display period, and to control the interference subpixel to be switched off during the first period of time in each display period and switched on during a second period of time in each display period.

In certain embodiments, a duration of the first period of time is greater than or equal to that of the second period of time.

In certain embodiments, a ratio of the duration of the first period of time to the duration of the second period of time is greater than or equal to 1 and smaller than or equal to 5.

In certain embodiments, when the display subpixel and the interference subpixel have a same gray scale, the color of the display subpixel and the color of the interference subpixel constitute complementary colors.

Specifically, the display subpixel is a red subpixel, and the interference subpixel is a cyan subpixel. Alternatively, the display subpixel is a green subpixel, and the interference subpixel is a magenta subpixel. As a further alternative, the display subpixel is a blue subpixel, and the interference subpixel is a green subpixel.

In certain embodiments, the display subpixel and the interference subpixel respectively comprise: a first electrode layer made of a reflective metal; a light emitting layer arranged on a side of the first electrode layer; and a second electrode layer arranged on a side of the light emitting layer away from the first electrode layer.

In certain embodiments, the light emitting layers of the display subpixel and the interference subpixel are configured to emit red light, green light, blue light, cyan light, magenta light or yellow light.

In certain embodiments, the light emitting layers of the display subpixel and the interference subpixel are configured to emit white light. Besides, the display subpixel and the interference subpixel further comprise a color resist layer.

In certain embodiments, when the colors of the interference subpixel and the display subpixel are the same, the gray scales of the interference subpixel and the display subpixel have a difference greater than or equal to 50.

This disclosure further proposes a display device, comprising a display panel provided by any of the above embodiments.

This disclosure further proposes a display system, comprising a wearable device and a display device provided by the above embodiment. The wearable device comprises lenses and a second control unit. The second control unit is configured to control the lenses to be transmissive during the first period of time and non-transmissive during the second period of time.

This disclosure further proposes a method for controlling a display panel. Specifically, the display panel comprises a plurality of pixel units. Each pixel unit comprises a plurality of subpixels. Each subpixel comprises a display subpixel and an interference subpixel. The interference subpixel and the display subpixel have different colors and/or gray scales. The method comprises the following steps: controlling the display subpixel to be switched on during a first period of time in each display period; and controlling the interference subpixel to be switched off during the first period of time in each display period and switched on during a second period of time in each display period.

With the above proposed technical solution, when the display panel outputs an image, the display subpixel and the interference subpixel will be switched on respectively during different periods of time, so as to output a normal image and an interference image respectively. Since the colors and/or the gray scales of the interference subpixel and the display subpixel are different, the viewer will see a different image during the second period of time from that during the first period of time. However, due to visual persistence of human eyes for a varying image, the viewer will see a superimposition of the interference image and the normal image, and thus cannot see clearly the outputted normal image. In this way, by using a particular viewing device, an intended user of the display panel can receive only the image of the first period of time, while other people who do not use such a viewing device will not be able to see clearly the outputted image. Therefore, the normal image outputted by the display panel will be effectively prevented from being identified by other people.

BRIEF DESCRIPTION OF DRAWINGS

Features and merits of this disclosure will be understood more clearly with reference to the drawings. However, the drawings are only schematic but should not be construed as any limitation to this disclosure. In the drawings.

DETAILED DESCRIPTION OF EMBODIMENTS

In order to help understand more clearly the above goals, features and merits of this disclosure, this disclosure will be further described in detail with reference to the drawings and specific embodiments. It should be noted that the embodiments of the present application and the features of the embodiments may be combined with each other where not contradictory.

Many specific details will be illustrated in the depictions below to facilitate a thorough understanding of this disclosure. However, this disclosure may also be implemented in other manners different from the one depicted here. Therefore, the protection scope of this disclosure is not limited by the specific embodiments disclosed below.

Figure 1:
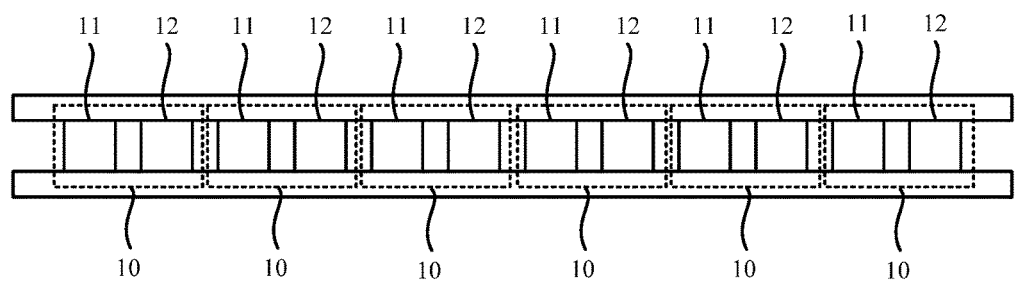
FIG. 1 shows a schematic structure view of a display panel according to an embodiment of this disclosure.

As shown in FIG. 1, the display panel according to an embodiment of this disclosure, may comprise a plurality of pixel units and a first control unit. Each pixel unit specifically comprises a plurality of subpixels. Each subpixel 10 may comprise a display subpixel 11 and an interference subpixel 12. Besides, the interference subpixel 12 and the display subpixel 11 have different colors and/or gray scales. The first control unit can be configured to control the display subpixel 11 to be switched on during a first period of time in each display period, and the interference subpixel 12 to be switched off during the first period of time in each display period and switched on during a second period of time in each display period.

Figure 2:
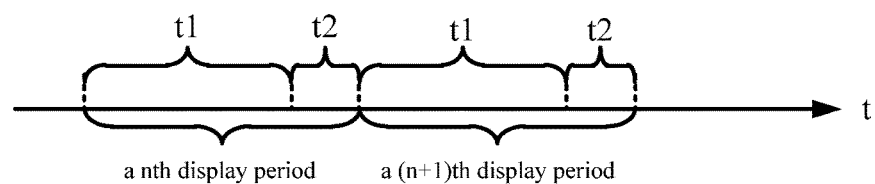
FIG. 2 shows a schematic view of switching times for a display subpixel and an interference subpixel according to an embodiment of this disclosure.

According to this embodiment, when the display panel outputs an image, the display subpixel and the interference subpixel will be switched on respectively during different periods of time, so as to output a normal image and an interference image respectively. For example, as shown in FIG. 2, the display subpixel can be switched on during a first period of time t1 in an nth frame to output a normal image. While, the interference subpixel can be switched on during a second period of time t2 in the nth frame to output an interference image. In a similar way, the display subpixel can be switched on during a first period of time t1 in an (n+1)th frame to output a normal image; and the interference subpixel may be switched on during a second period of time t2 in the (n+1)th frame to output an interference image; and so forth. In this case, n is an integer greater than or equal to 1.

Since at least one of the color and the gray scale of the interference subpixel and the display subpixel are different, the viewer will see a different image during the second period of time from that during the first period of time. However, due to visual persistence of human eyes for a varying image, the viewer will see a superimposition of the interference image and the normal image, and thus cannot see clearly the outputted normal image. In this way, by using a particular viewing device, an intended user of the display panel can receive only the image of the first period of time, while other people who do not use such a viewing device will not be able to see clearly the outputted image. Therefore, the normal image outputted by the display panel will be effectively prevented from being identified by other people.

It should be noted that the first period of time in each display period can be arranged ahead of the second period of time. Obviously, as another alternative, the second period of time can also be arranged ahead of the first period of time. A display period in the above embodiment can refer to a sum of a time duration for one scanning of the display subpixel in the display panel and a time duration for one scanning of the interference subpixel in the display panel.

In certain embodiments, the first period of time may have a time duration greater than or equal to that of the second period of time.

This embodiment can ensure that the display duration of the normal image during each period (frame) is greater than or equal to that of the interference image. Thereby, a user wearing a particular viewing device can see the normal image well enough without an intense feeling of being interrupted.

Specifically, a ratio of the duration of the first period of time to the duration of the second period of time may be k, wherein k is greater than or equal to 1 and smaller than or equal to 5.

This embodiment, on one hand, can ensure that the display duration of the normal image during each period (frame) is greater than or equal to that of the interference image. Thereby, a user wearing a particular viewing device can see the normal image well enough without an intense feeling of being interrupted. On the other hand, it can also ensure that the interference image can have a sufficiently strong interference effect on the normal image, such that a peeper who does not wear the particular viewing device cannot see the normal image clearly.

In certain embodiments, when the display subpixel and the interference subpixel have a same gray scale, the color of the display subpixel and the color of the interference subpixel may constitute complementary colors.

Figure 3:
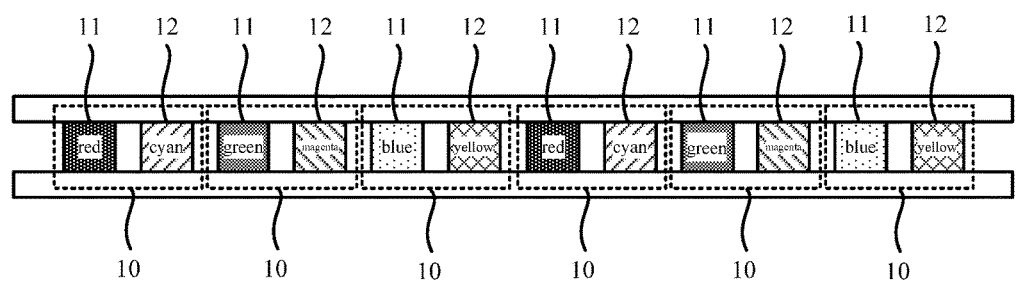
FIG. 3 shows a schematic structure view of a display panel according to another embodiment of this disclosure.

As shown in FIG. 3, specifically, the display subpixel may be a red subpixel, and the interference subpixel may be a cyan subpixel. Alternatively, the display subpixel may be a green subpixel, and the interference subpixel may be a magenta subpixel. As a further alternative, the display subpixel may be a blue subpixel, and the interference subpixel may be a green subpixel.

Since the superimposition of two colors which are complementary is white, according to this embodiment, when the peeper who does not wear the particular viewing device views the display subpixel and the interference subpixel, he/she can only see a white image due to visual persistence. Accordingly, the normal image can be effectively prevented from being identified by other people.

Figure 4:
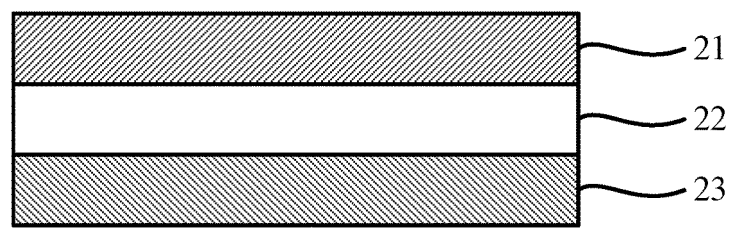
FIG. 4 shows a schematic structure view of a display subpixel or an interference subpixel according to an embodiment of this disclosure.

As shown in FIG. 4, in certain embodiments, the display subpixel and the interference subpixel may respectively comprise: a first electrode layer 21 made of a reflective metal; a light emitting layer 22 arranged on a side of the first electrode layer; and a second electrode layer 23 arranged on a side of the light emitting layer away from the first electrode layer.

The display panel in this embodiment can be an organic light emitting diode display panel.

In certain embodiments, the light emitting layers of the display subpixel and the interference subpixel can be configured to emit red light, green light, blue light, cyan light, magenta light or yellow light.

In this embodiment, the light emitting layer, the first electrode layer and the second electrode layer can directly constitute subpixels.

Figure 5:
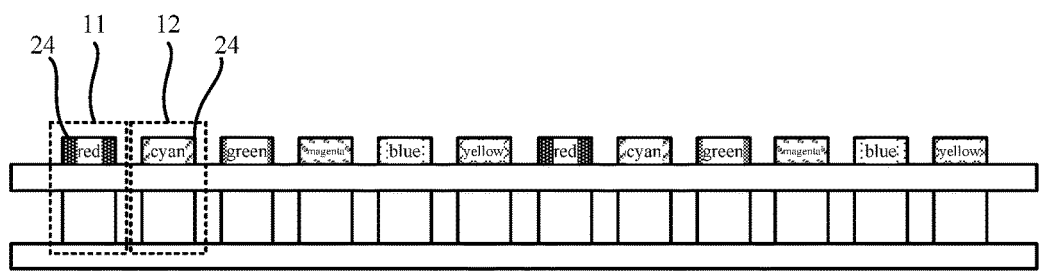
FIG. 5 shows a schematic structure view of a display panel according to yet another embodiment of this disclosure.

Furthermore, in certain embodiments, as shown in FIG. 5, the light emitting layers of the display subpixel and the interference subpixel can be configured to emit white light. In this case, the display subpixel and the interference subpixel may further comprise a color resist layer 24. For example, the color resist layer 24 can be arranged on a light exit side of the light emitting layer.

With such a color resist layer, white light can be turned into colored light such as red light, green light, blue light, cyan light, magenta light or yellow light corresponding to the color resist layer after passing through the color resist layer.

In certain embodiments, when the colors of the interference subpixel and the display subpixel are the same, the gray scales of the interference subpixel and the display subpixel may have a difference greater than or equal to 50.

According to this embodiment, the gray scales of the display subpixel and the interference subpixel can be arranged to be different, and lighting brightness of these subpixels can be controlled by a circuit. The light emitting layers can be made of a same material, which helps to simplify the structure.

This disclosure further proposes a display device, comprising any of the above display panels.

It should be noted that the display device in this embodiment can be any product or component having a display function, such as electronic paper, a handset, a tablet computer, a television, a notebook computer, a digital photo frame, a navigator or the like.

This disclosure further proposes a display system, which may comprise a wearable device and the display device. The wearable device specifically may comprise lenses and a second control unit. The second control unit may be further configured to control the lenses to be transmissive during the first period of time and non-transmissive during the second period of time.

According to this embodiment, the user can view the display device by wearing a wearable device, and thus only see the normal image outputted by the display subpixel during the first period of time. For other people who do not wear such a wearable device, they will see a superimposed image of the normal image and the interference image, and thus cannot identify content in the normal image. In this way, the effect of anti-peeping is achieved.

This disclosure further proposes a method for controlling a display panel. The display panel in this case may comprise a plurality of pixel units. Each pixel unit may comprise a plurality of subpixels. Each subpixel may comprise a display subpixel and an interference subpixel. Besides, the interference subpixel and the display subpixel may have different colors and/or gray scales. Specifically, the method comprises: controlling the display subpixel to be switched on during a first period of time of each display period, and controlling the interference subpixel to be switched off during the first period of time of each display period and switched on during a second period of time of each display period.

The technical solution of this disclosure is explained in detail with reference to the drawings in an attempt to solve the problem of difficulty in completely preventing a peeper from seeing an image outputted by the display panel. With the technical solution provided by the embodiment of this disclosure, when the display panel outputs an image, the display subpixel and the interference subpixel will be switched on respectively during different periods of time, so as to output a normal image and an interference image respectively. Since the colors and/or the gray scales of the interference subpixel and the display subpixel are different, the viewer will see an image during the second period of time different from the one seen during the first period of time. However, due to visual persistence of human eyes for a varying image, the viewer will see a superimposition of the interference image and the normal image, and thus cannot see clearly the outputted normal image. In this case, by using a particular viewing device, an intended user of the display panel can receive only the image of the first period of time, while other people who do not use such a viewing device will not be able to see clearly the outputted image. Thereby, the normal image outputted by the display panel will be effectively prevented from being identified by other people.

It should be pointed out that sizes of the layers and regions may be exaggerated in the drawings for clarity of the illustration. It can be understood that when an element or a layer is depicted as being located "above" a further element or layer, this means that it can be disposed above the further element or layer directly, or with an intermediate layer. Besides, it can be understood that when an element or a layer is depicted as being located "below" a further element or layer, this means that it can be disposed below the further element or layer directly, or with more than one intermediate layer or element. In addition, it can also be understood that when a layer or an element is depicted as being located "between" two layers or two elements, this means that it can be a layer between the two layers or two elements uniquely, or with more than one intermediate layer or element. Throughout the description, similar reference signs indicate similar elements.

In this disclosure, terms such as "first" and "second" are only used for descriptive purposes and should not be construed as indicating or suggesting relative importance. Unless otherwise explicitly defined, term "multiple" means two or more.

The above contents are only preferred embodiments of this disclosure, but not intended to limit this disclosure. For those skilled in the art, various modifications and variations can be made to this disclosure. Any modification, equivalent replacement, improvement and so on made within spirits and teachings of this disclosure shall fall within the protection scope of this disclosure.

The invention claimed is:

1. A display panel, comprising:
   a plurality of pixel units, wherein each pixel unit comprises a plurality of subpixels, and each subpixel comprises a display subpixel and an interference subpixel; and
   a first control circuit configured to control the display subpixel to be switched on during a first period of time in each display period, and to control the interference subpixel to be switched off during the first period of time in each display period and switched on during a second period of time in each display period, wherein
   the colors of the interference subpixel and the display subpixel are the same, and
   a difference between the gray scales of the interference subpixel and the display subpixel is greater than or equal to 50.

2. The display panel according to claim 1, wherein a duration of the first period of time is greater than or equal to that of the second period of time.

3. The display panel according to claim 2, wherein a ratio of the duration of the first period of time to the duration of the second period of time is greater than or equal to 1 and smaller than or equal to 5.

4. The display panel according to claim 1, wherein the display subpixel and the interference subpixel respectively comprise:
   a first electrode layer made of a reflective metal;
   a light emitting layer arranged on a side of the first electrode layer; and
   a second electrode layer arranged on a side of the light emitting layer away from the first electrode layer.

5. The display panel according to claim 4, wherein the light emitting layers of the display subpixel and the interference subpixel are configured to emit red light, green light, blue light, cyan light, magenta light or yellow light.

6. The display panel according to claim 4, wherein the light emitting layers of the display subpixel and the interference subpixel are configured to emit white light, and the display subpixel and the interference subpixel further comprise a color resist layer.

7. A display device comprising the display panel according to claim 1.

8. A display system, comprising:
   a wearable device, and
   the display device according to claim 7,
   wherein the wearable device comprises lenses and a second control circuit, the second control circuit being configured to control the lenses to be transmissive during the first period of time and non-transmissive during the second period of time.

9. The display system according to claim 8, wherein a duration of the first period of time is greater than or equal to that of the second period of time.

10. The display system according to claim 8, wherein the display subpixel and the interference subpixel respectively comprise:
    a first electrode layer made of a reflective metal;
    a light emitting layer arranged on a side of the first electrode layer; and
    a second electrode layer arranged on a side of the light emitting layer away from the first electrode layer.

11. The display device according to claim 7, wherein a duration of the first period of time is greater than or equal to that of the second period of time.

12. The display device according to claim 7, wherein the display subpixel and the interference subpixel respectively comprise:
    a first electrode layer made of a reflective metal;
    a light emitting layer arranged on a side of the first electrode layer; and
    a second electrode layer arranged on a side of the light emitting layer away from the first electrode layer.

13. A method for controlling a display panel, wherein the display panel comprises a plurality of pixel units, each pixel unit comprising a plurality of subpixels, and each subpixel comprising a display subpixel and an interference subpixel, the method comprising:
    controlling the display subpixel to be switched on during a first period of time in each display period, and
    controlling the interference subpixel to be switched off during the first period of time in each display period and switched on during a second period of time in each display period, wherein
    the colors of the interference subpixel and the display subpixel are the same, and
    a difference between the gray scales of the interference subpixel and the display subpixel is greater than or equal to 50.

* * * * *